(12) United States Patent
Mattsson et al.

(10) Patent No.: US 10,121,845 B2
(45) Date of Patent: *Nov. 6, 2018

(54) INDUCTOR LAYOUT, AND A VOLTAGE-CONTROLLED OSCILLATOR (VCO) SYSTEM

(71) Applicant: Telefonaktiebolaget L M Ericsson (publ), Stockholm (SE)

(72) Inventors: Thomas Mattsson, Limhamn (SE); Pietro Andreani, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/041,108

(22) Filed: Feb. 11, 2016

(65) Prior Publication Data

US 2016/0203903 A1 Jul. 14, 2016

Related U.S. Application Data

(63) Continuation of application No. 14/387,462, filed as application No. PCT/EP2013/056883 on Apr. 2, 2013, now Pat. No. 9,299,764.

(Continued)

(30) Foreign Application Priority Data

Apr. 3, 2012 (EP) .................................... 12162984

(51) Int. Cl.
  *H01F 27/28* (2006.01)
  *H01F 27/34* (2006.01)

(Continued)

(52) U.S. Cl.
  CPC ......... *H01L 28/10* (2013.01); *H01F 17/0006* (2013.01); *H01F 27/2804* (2013.01);
  (Continued)

(58) Field of Classification Search
  CPC . H01L 28/10; H01F 27/2804; H01F 17/0006; H01F 27/28; H03B 2201/0216;
  (Continued)

(56) References Cited

U.S. PATENT DOCUMENTS 5,072,222 A 12/1991 Fockens
5,351,688 A * 10/1994 Jones ............... G01R 33/34046
324/318

(Continued)

FOREIGN PATENT DOCUMENTS

CN 1613175 A 5/2005
CN 101057391 A 10/2007
(Continued)

OTHER PUBLICATIONS

Tesson, O., "High Quality Monolithic 8-shaped Inductors for Silicon RF IC Design", IEEE Topical Meeting on Silicon Monolithic Integrated Circuits in RF Systems, Jan. 23, 2008, pp. 94-97, IEEE, Orlando, FL.

(Continued)

*Primary Examiner* — Andrew Wendell
(74) *Attorney, Agent, or Firm* — Coats & Bennett, PLLC

(57) ABSTRACT

An inductor layout comprising a first inductor and a second inductor. The first and second inductors are electrically and magnetically independent inductors concentrically arranged on an integrated circuit. At least one of the first and second inductors is a multi-loop inductor with a first axis of symmetry.

26 Claims, 9 Drawing Sheets

Related U.S. Application Data

(60) Provisional application No. 61/637,323, filed on Apr. 24, 2012.

(51) Int. Cl.
  H04B 1/40 (2015.01)
  H01L 49/02 (2006.01)
  H03B 5/12 (2006.01)
  H01F 17/00 (2006.01)
  H03B 5/02 (2006.01)

(52) U.S. Cl.
  CPC .............. H03B 5/02 (2013.01); H03B 5/12 (2013.01); H04B 1/40 (2013.01); *H01F 27/346* (2013.01); *H01F 2017/0073* (2013.01); *H03B 2201/0216* (2013.01)

(58) Field of Classification Search
  CPC .......... H04B 1/40; H04B 1/04; H04B 5/0075; H04B 5/0081; H04B 7/0469
  See application file for complete search history.

(56) References Cited

U.S. PATENT DOCUMENTS

| | | | |
|---|---|---|---|
| 6,621,365 | B1 | 9/2003 | Hallivuori et al. |
| 7,005,930 | B1 | 2/2006 | Kim et al. |
| 7,151,430 | B2 | 12/2006 | Mattison |
| 7,432,794 | B2 | 10/2008 | Mattsson |
| 8,183,971 | B2 | 5/2012 | Le Gulliou et al. |
| 8,331,978 | B2 | 12/2012 | Bhagat et al. |
| 8,995,935 | B2 | 3/2015 | Mihota |
| 9,299,764 | B2 * | 3/2016 | Mattsson ............ H01F 17/0006 |
| 2005/0052272 | A1 | 3/2005 | Tiebout |
| 2005/0195063 | A1 | 9/2005 | Mattsson |
| 2005/0237772 | A1 | 10/2005 | Batarseh et al. |
| 2009/0085689 | A1 | 4/2009 | Rohani et al. |
| 2009/0134954 | A1 | 5/2009 | Uzunov et al. |
| 2009/0167466 | A1 | 7/2009 | Qiu et al. |
| 2010/0148882 | A1 | 6/2010 | Bouttement |
| 2010/0164667 | A1 | 7/2010 | Ho-Hsiang |
| 2010/0171557 | A1 | 7/2010 | Tsukizawa |
| 2011/0006872 | A1 | 1/2011 | Nazarian |
| 2011/0148536 | A1 | 6/2011 | Italia et al. |
| 2012/0244802 | A1 | 9/2012 | Feng et al. |
| 2012/0286889 | A1 | 11/2012 | Park et al. |
| 2012/0302188 | A1 | 11/2012 | Sahota et al. |
| 2013/0051493 | A1 | 2/2013 | Mo et al. |
| 2013/0141177 | A1 | 6/2013 | Narathong et al. |
| 2013/0165058 | A1 | 6/2013 | Mostafa et al. |

FOREIGN PATENT DOCUMENTS

| | | |
|---|---|---|
| CN | 101682293 A | 7/2013 |
| CN | 103227647 A | 7/2013 |
| EP | 2110821 A2 | 10/2009 |
| RU | 92273 U | 3/2010 |
| RU | 2012122227 A | 12/2013 |
| WO | 03038999 A1 | 5/2003 |
| WO | 03052780 A1 | 6/2003 |
| WO | 2007006867 A1 | 1/2007 |
| WO | 2009081342 A1 | 7/2009 |

OTHER PUBLICATIONS

Deng, W., et al., "A 25MHz-6.44GHz LC-VCO Using a 5-port Inductor for Multiband Frequency Generation", IEEE Radio Frequency Integrated Circuits Symposium (RFIC), 2011 IEEE RFIC Virtual Journal, Jun. 5, 2011, pp. 1-4, IEEE, Baltimore, MD.

3rd Generation Partnership Project, "Technical Specification Group Radio Access Network; Evolved Universal Terrestrial Radio Access (E-UTRA); User Equipment (UE) radio transmission and reception (Release 11);" 3GPP TS 36.101 v11.1.0, Technical Specification, Jun. 1, 2012, Valbonne, France, pp. 1-336.

* cited by examiner

INDUCTOR LAYOUT, AND A VOLTAGE-CONTROLLED OSCILLATOR (VCO) SYSTEM

This application is a continuation of U.S. patent application Ser. No. 14/387,462, filed 23 Sep. 2014, which is a National Stage of International Application No. PCT/EP2013/056883, filed 2 Apr. 2013, which claims the benefit of U.S. Provisional Application Ser. No. 61/637,323, filed 24 Apr. 2012, which in turn claims the benefit of foreign application Serial No. EP 12162984.4, filed 3 Apr. 2012, the disclosures of each of which are incorporated herein by reference in their entirety.

TECHNICAL FIELD

Embodiments herein relates to an inductor layout, a Voltage-Controlled Oscillator (VCO) system, an integrated circuit subsystem, an integrated Radio Frequency (RF) transceiver circuit, a communication device and use of an inductor layout in the integrated circuit. Especially, embodiments relate to frequency tuning in the integrated circuit.

BACKGROUND

Future integrated RF transceiver circuits used in cellular communications devices will have to handle a constantly increasing number of cellular standards and associated frequency bands. The requirements on the frequency tuning ranges of the Voltage-Controlled Oscillators (VCOs) in the Local Oscillator (LO) signal generation subsystem are getting harder to meet while maintaining acceptable performance on other critical specification points like phase noise, current consumption, etc.

The trend towards single die solutions, also referred to as "System on Chip" solutions, forces the RF building blocks to be implemented in "digital" semiconductor processes with poor prerequisites for providing high performance VCO design. This makes it difficult to improve the performance of current solutions to meet the new demands. By "digital" semiconductor processes is meant semiconductor processes optimized for high volume fabrication of large digital circuits at a low cost. These processes do not support special process features like metal-insulator-metal (MIM) capacitors, thick metal layers required by high-Q inductors, and Metal Oxide Semiconductor (MOS) varicaps that facilitate design of high performance analog RF blocks.

A number of new dual-mode VCO designs have been proposed that are addressing the problem how to increase the tuning range compared to that of a state-of-the-art single VCO. Unfortunately, these designs all suffer from degradation of other performance parameters due to the extended tuning range. The use of inductance switching or dual-mode transformer type resonators is associated with degradation of phase noise performance due to unavoidable introduction of additional losses in the resonator circuit.

Alternative Phased-Locked Loop (PLL) solutions using Local Oscillator (LO) frequency dividers with other division ratios than multiples of two reduce the required VCO tuning range but they show a number of unwanted properties regarding waveform duty cycle, quadrature signal output availability, IQ phase accuracy etc.

Using multiple VCOs to cover the required frequency range is a straightforward and flexible solution with the obvious drawback in terms of increased silicon area for those parts of the integrated circuit that contain the VCOs. FIG. 1 illustrates the VCO part of a prior art integrated circuit 100 comprising two separately arranged VCOs 102, 104, each of which VCOs 102,104 comprises a respective inductor 106,108, and a respective capacitor bank 110,112. As illustrated, the use of two VCOs according to the prior art will increase the area of the integrated circuit that is needed as compared to the case when only a single VCO is used. Thus, a disadvantage with the multiple VCOs is the required increased area of the integrated circuit as compared to a single VCO solution. This is especially a disadvantage since the integrated circuits tend to be smaller and smaller in order to fit in smaller and smaller electronic devices. There is also a fabrication cost directly related to the total chip area of the integrated circuit.

Further, the size of the inductor comprised in a VCO or other tuned circuit is not scaling with the technology development and will in the future become a more dominating component on the integrated circuit area.

SUMMARY

An object of embodiments herein is to improve frequency tuning range in an integrated circuit.

According to a first aspect of embodiments herein, the object is achieved by an inductor layout. The inductor layout comprises a first inductor and a second inductor. The first and second inductors are independent inductors concentrically arranged on an integrated circuit. Further, at least one of the first and second inductors is a multi-loop inductor with a first axis of symmetry.

Since the first and second inductors are independent inductors concentrically arranged on an integrated circuit, and since at least one of the first and second inductors is a multi-loop inductor with a first axis of symmetry, the tuning range is increased without increasing the area of the inductor layout. This results in an improved inductor layout for frequency tuning in an integrated circuit.

According to a second aspect of embodiments herein, the object is achieved by a VCO system for frequency generation in an integrated circuit. The VCO system comprises an inductor layout according to embodiments described herein.

According to a third aspect of embodiments herein, the object is achieved by an integrated circuit subsystem for frequency generation. The integrated circuit subsystem comprises a VCO system according to embodiments described herein.

According to a fourth aspect of embodiments herein, the object is achieved by an integrated RF transceiver circuit. The integrated RF transceiver circuit comprises a VCO system according to embodiments described herein.

According to a fifth aspect of embodiments herein, the object is achieved by a communication device comprising an integrated RF transceiver circuit according to embodiments described herein.

According to a sixth aspect of embodiments herein, the object is achieved by using an inductor layout according to embodiments described herein in an integrated circuit for frequency tuning.

An advantage of embodiments herein is that the improved inductor layout provides for an increased tuning range relative to the used area of the inductor layout as compared to prior art inductor layouts.

A further advantage of embodiments herein is that they provide an attractive wide tuning range solution in a situation where two VCOs are chosen to cover the required frequency tuning range.

BRIEF DESCRIPTION OF THE DRAWINGS

Examples of embodiments herein are described in more detail with reference to attached drawings in which.

DETAILED DESCRIPTION

Embodiments herein will be exemplified in the following non-limiting description.

Figure 1:
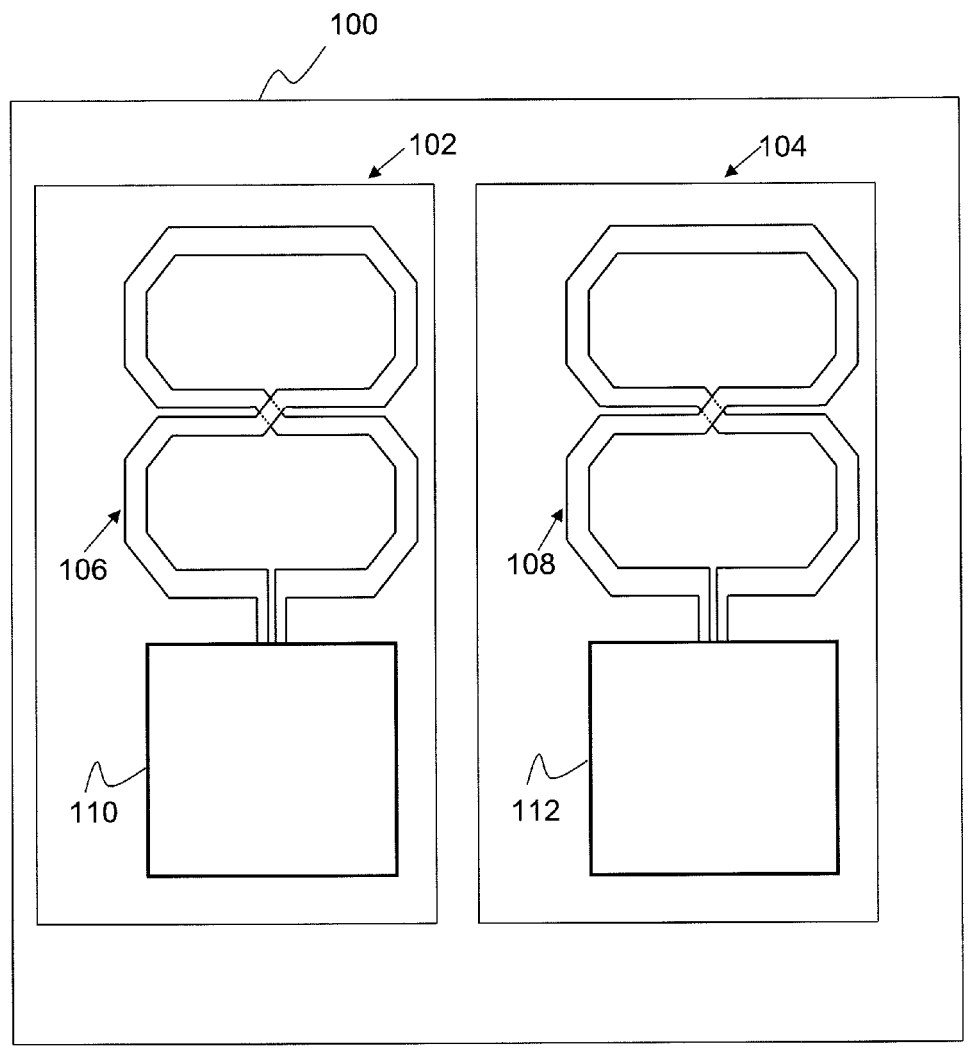
FIG. 1 is a floor-plan layout illustrating an integrated circuit comprising inductors having a layout according to prior art.
Figure 2:
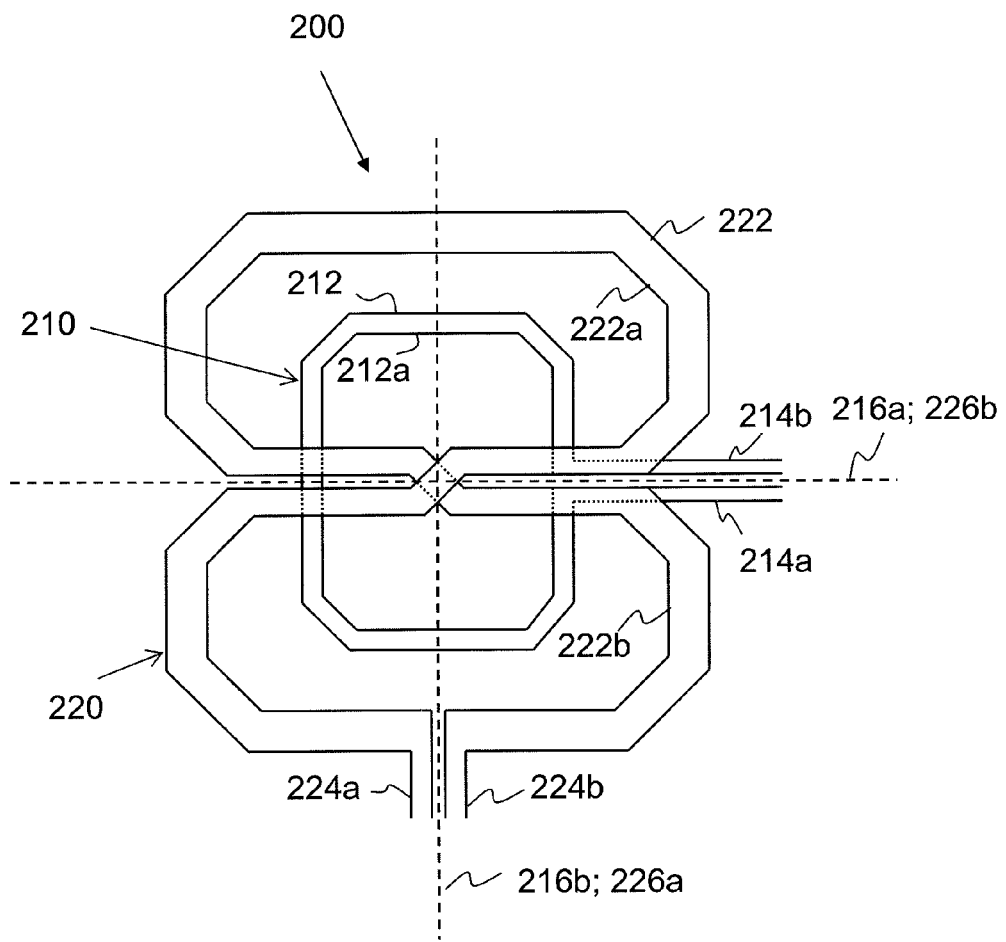
FIG. 2 schematically illustrates embodiments of an inductor layout comprising one 0-shaped and one 8-shaped inductor.
Figure 3:
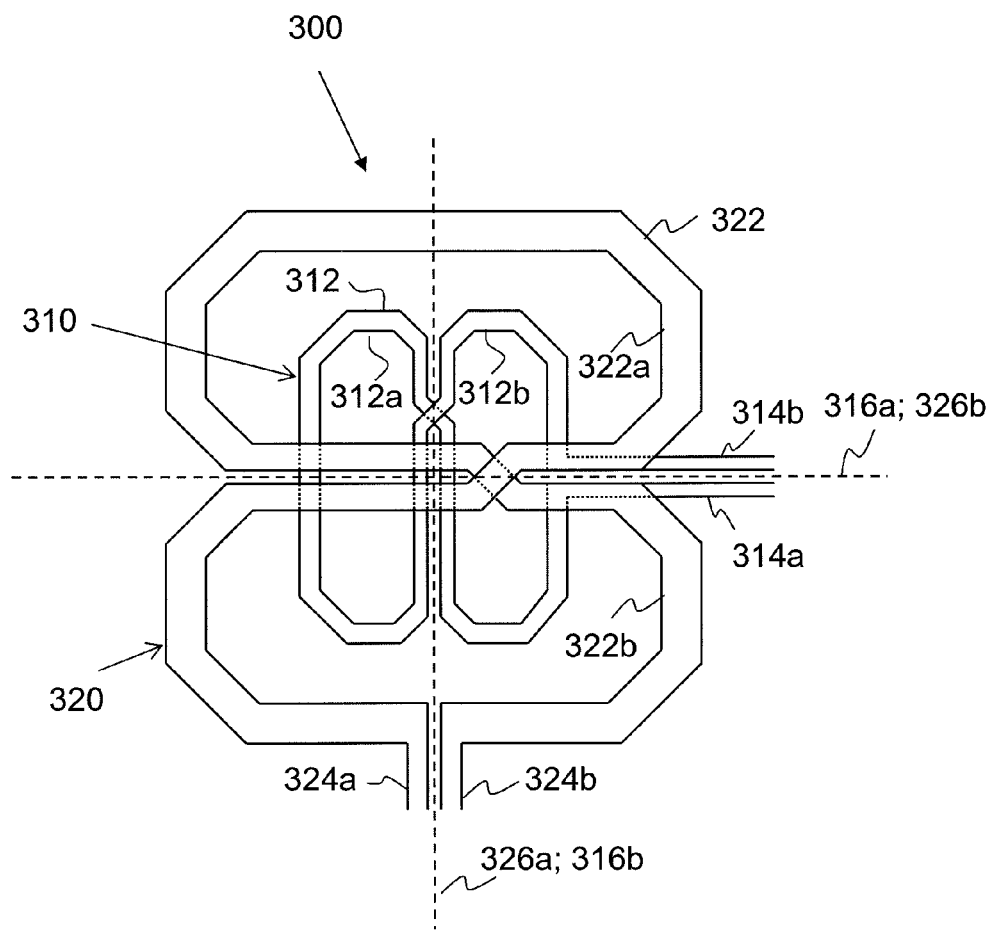
FIG. 3 schematically illustrates embodiments of an inductor layout comprising two 8-shaped inductors.

FIGS. 2, 3, and 4 schematically illustrate embodiments of an inductor layout 200,300,400. Embodiments of the inductor layout 200,300,400 provide for an increased frequency tuning range relative the used area of an integrated circuit (not shown in FIGS. 2-4) as compared to the prior art inductor layouts using the same area size.

The inductor layout 200,300,400 comprises a first inductor 210,310,410 and a second inductor 220,320,420. The first and second inductors 210,310,410; 220,320,420 are electrically and magnetically independent inductors.

By the expression "electrically and magnetically independent inductor" is meant that the inductors have a very small mutual electro-magnetic coupling coefficient k, normally much less than 0,1. Thus, the first and second inductors 210,310,410; 220,320,420 being independent inductors show no or low electromagnetic interaction with each other.

Further, the first and second inductors 210,310,410; 220, 320,420 are concentrically arranged on the integrated circuit.

By the expression "concentrically arranged on the integrated circuit" is meant that the inductors are arranged on the integrated circuit such that they share the same centre, e.g. the centre of the first inductor 210,310,410 and the centre of the second inductor 220,320,420 is the same. In other words, the centre of the first inductor 210,310,410 and the centre of the second inductor 220,320,420 are coinciding. It should be understood that the term "concentrically" when used herein should not be limited to the case when one of the inductors is smaller than the other and located inside the other, but it should be understood that the two inductors may be of the same size and still be concentrically arranged.

Furthermore, at least one of the first and second inductors 210,310,410; 220,320,420 is a multi-loop inductor with a first axis 226,316,326,416,426 of symmetry.

FIG. 2 schematically illustrates first embodiments of an inductor layout 200. As schematically illustrated, the inductor layout 200 comprises a first inductor 210. The first inductor 210 has a single inductor coil 212 which is o-shaped with a single loop 212a. Further, the first inductor 210 comprises first and second inductor terminals 214a, 214b, and first and second axes 216a,216b of symmetry. The intersection point of the first and second axes 216a,216b of symmetry defines the centre of the first inductor 210.

The inductor layout 200 comprises further a second inductor 220. The second inductor 220 is a multi-loop inductor comprising an inductor coil 222. The inductor coil 220 is in the shape of a FIG. 8 with a first inductor loop 222a and a second inductor loop 222b. Further, the second inductor 220 comprises first and second inductor terminals 224a, 224b, and first and second axes 226a,226b of symmetry. The intersection point of the first and second axes 226a,226b of symmetry defines the centre of the second inductor 220.

FIG. 3 schematically illustrates second embodiments of an inductor layout 300. As schematically illustrated, the inductor layout 300 comprises a first inductor 310. The first inductor 310 is a multi-loop inductor and comprises an inductor coil 312. The inductor coil 312 is in the shape of a FIG. 8 and has first inductor loop 312a and a second inductor loop 312b. Further, the first inductor 310 comprises first and second inductor terminals 314a,314b, and first and second axes 316a,316b of symmetry. The intersection point of the first and second axes 316a,316b of symmetry defines the centre of the first inductor 310.

Further, the inductor layout 300 comprises a second inductor 320. The second inductor 320 is a multi-loop inductor and comprises an inductor coil 322. The inductor coil 322 is in the shape of FIG. 8 and has a first inductor loop 322a and a second inductor loop 322b. Further, the second inductor 320 comprises first and second inductor terminals 324a, 324b, and first and second axes 326a,326b of symmetry. The intersection point of the first and second axes 326a,326b of symmetry defines the centre of the second inductor 320.

Figure 4A:
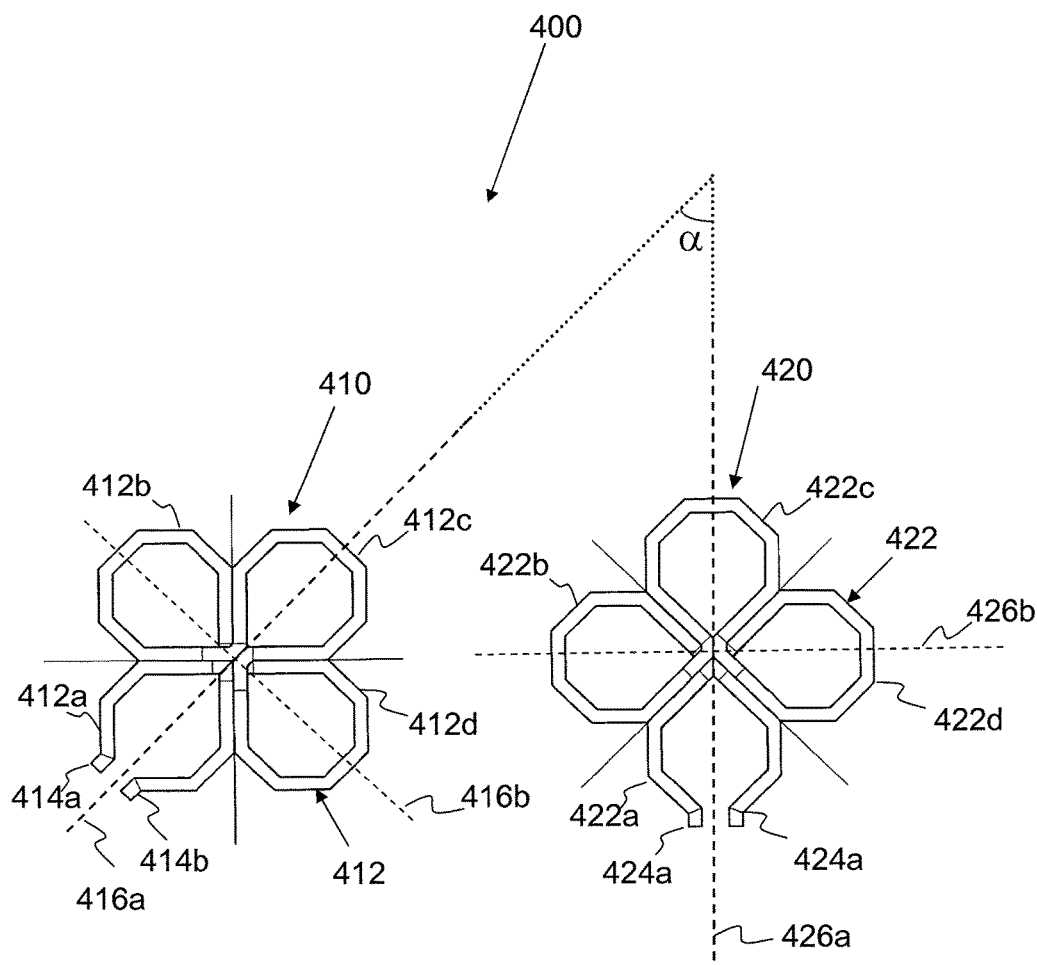
FIGS. 4a,4b schematically illustrate embodiments of an inductor layout comprising two clover-leaf shaped inductors.
Figure 4B:
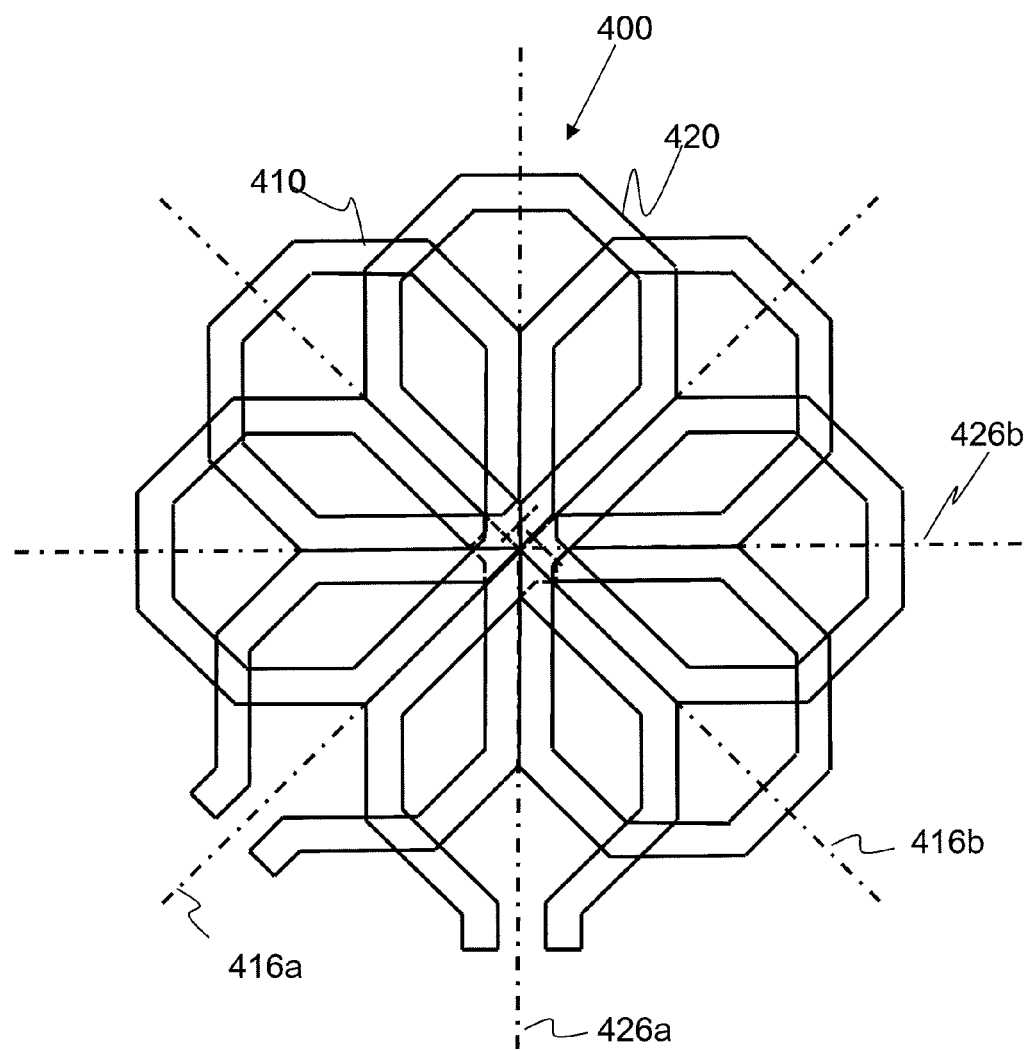

FIGS. 4a and 4b schematically illustrate third embodiments of an inductor layout 400. As schematically illustrated in FIG. 4a, the inductor layout 400 comprises a first inductor 410. The first inductor 410 is a multi-loop inductor and has an inductor coil 412. The inductor coil 412 is in the shape of a four-leaf clover and has a first inductor loop 412a, a second inductor loop 412b, a third inductor loop 412c, and a fourth inductor loop 412d. Further, the first inductor 410 comprises first and second inductor terminals 414a, 414b, and first and second axes 416a,416b of symmetry. The intersection point of the first and second axes 416a,416b of symmetry defines the centre of the first inductor 410.

The inductor layout 400 comprises further a second inductor 420. The second inductor 420 is a multi-loop inductor and has an inductor coil 422. The inductor coil 422 is in the shape of four-leaf clover and has a first inductor loop 422a, a second inductor loop 422b, a third inductor loop 422c, and a fourth inductor loop 422d. Further, the second inductor 420 comprises first and second inductor terminals 424a, 424b, and first and second axes 426a,426b of symmetry. The intersection point of the first and second axes 426a,426b of symmetry defines the centre of the second inductor 420.

For clarity reason, the four-leaf clover-shaped first and second inductors 410,420 are shown separated from each other in FIG. 4a, but it should be understood that the first and second four-leaf clover-shaped inductors 410,420 are arranged concentrically on the integrated circuit as schematically illustrated in FIG. 4b.

In some embodiments, the multi-loop inductor comprises an even number of inductor loops 222,312,322,412,422 arranged in a plane of the multi-loop inductor such that magnetic fields emanating from the loops of the first inductor and picked up by the loops of the second inductor cancel each other.

It should be understood that in some embodiments, the crossover between two inductor loops in the same multi-loop inductor may be arranged in a metal layer of the integrated circuit that is different from the metal layer where the loops are arranged, but such embodiments will still be referred to as having the inductor loops arranged in the plane of the multi-loop inductor. Further, in some embodiments, the crossovers comprised in different multi-loop inductors are arranged non-overlapping in order to minimize the number of metal layers needed for the implementation.

As previously mentioned, at least one of the first and second inductors 210,310, 410; 220,320,420 is a multi-loop inductor with a first axis 226a,316a,326a,416a,426a of symmetry. Further, the other one of the at least one of the first and second inductors 310,410; 220,320,420 may also be a multi-loop inductor having a first axis 226a,316a,326a, 416a,426a of symmetry. In other words, both the first and second inductors 310,410; 220,320,420 may be multi-loop inductors.

Further, the first and second inductors 310,410; 220,320, 420 may be arranged rotated relative to each other in order to minimize the electro-magnetic coupling between them. Electro-magnetic coupling occurs between two conductors when they are configured such that a change in current flow through one wire induces a voltage across the ends of the other wire through electromagnetic induction.

In some embodiments, it is important for minimization of the mutual electro-magnetic coupling between the first and second inductors 310,410; 220,320,420 that the symmetry, position, and relative rotation of the first and second inductors 310,410; 220,320,420 are chosen in an optimal manner. Consequently, in order to minimize the electro-magnetic coupling between the first and second inductors 310,410; 220,320,420, the first and second inductors 310,410; 220, 320,420 should be arranged such that a change in current in one of the inductors does not or at least to a minimal extent induce a voltage across the ends of the other inductor. Thus, whether or not the first and second inductors 310,410; 220,320,420 are to be arranged rotated relative to each other, and if to be rotated, the degree of rotation, depends on the shape of the inductors. The angle of rotation depends on the number of loops of the inductor 310,410; 220,320,420 comprising the least number of loops. If this number is denoted N, the angle of rotation for minimum electro-magnetic coupling may be calculated as 180/N degrees for N values equal to or larger than 2. If N equals 1, no rotation is required but a certain angle that simplifies the inductor layout of the integrated circuit may be chosen.

Figure 8:
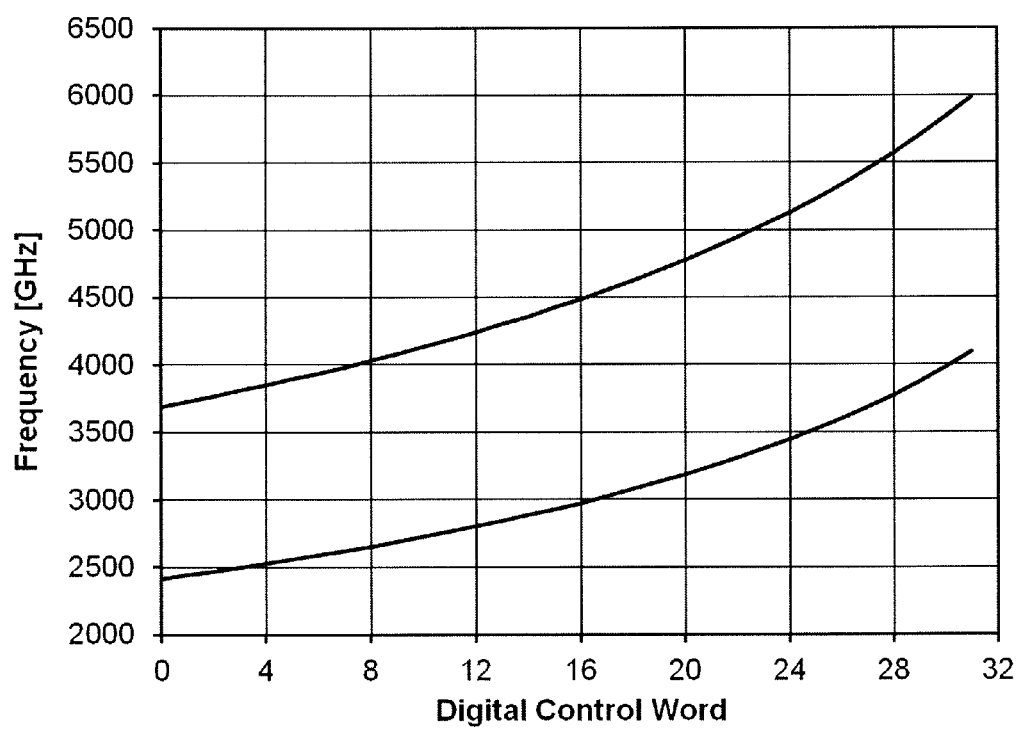
FIG. 8 schematically illustrates how the frequency ranges of two independent VCOs may be combined into a total tuning range.

As schematically illustrated in FIG. 3, the first and second inductors 310,320 are substantially figure 8-shaped. Each of the first and second inductors 310,320 comprises two inductor loops 312a,312b; 322a,322b. Further, the first and second inductors 310,320 may be arranged rotated relative to each other such that an angle between the first axis 316a of symmetry of the first inductor 310 and the first axis 326a of symmetry of the second inductor 320 is 90 degrees (N=2 yields rotation angle=180/2=90 degrees). A deviation from the optimal angle of rotation will increase the electro-magnetic coupling between the two inductors 310,410; 220,320,420, but the isolation may still be high enough for the intended application. In some embodiments, the angle may be in the interval between 85 and 95 degrees without substantial degradation of the performance.

By arranging the figured 8-shaped first and second inductors 310,320 rotated about 90 degrees relative each other, the electro-magnetic coupling between them is as small as possible, i.e. the electro-magnetic coupling between them is minimized, or at least substantially minimized. Further, the electro-magnetic coupling may also be minimized using clever inductor layout. By clever inductor layout is meant that the overlap area where the inductor wires are crossing is kept to a minimum and that the vertical and horizontal distance between the two inductors 310,320 should be maximized. These two layout factors dominating the mutual capacitance may be influenced by clever choice of wire width and metal layer.

Figure 5:
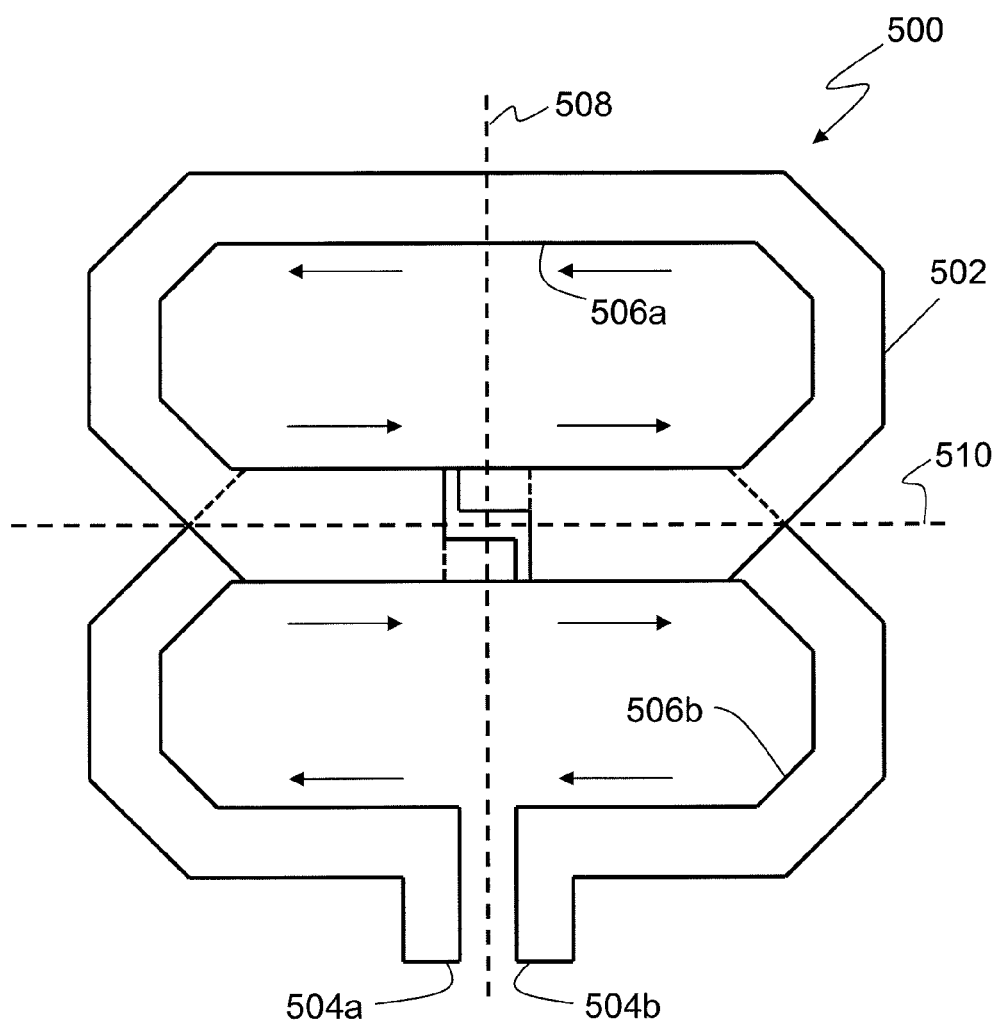
FIG. 5 schematically illustrates embodiments of an 8-shaped inductor.

FIG. 5 schematically illustrates an embodiment of a figure 8-shaped inductor 500. The inductor 500 has an inductor coil 502 and terminals 504a and 504b. It has been designed so that it is substantially symmetrical about a first axis 508 of symmetry. In the present example, the inductor coil 502 is in the form of a single-turn 8-shaped structure with an upper loop 506a and a lower loop 506b. By virtue of the figure-8 shape, current in the upper loop 506a travels in a direction (e.g., counterclockwise, see arrows) that is opposite to current in the lower loop 506b (e.g., clockwise). As a result, the Electromagnetic (EM) field components emanating at a certain distance from the two substantially symmetrical loops 506a and 506b also have opposite directions and tend to counteract each other. The directions of the EM field components are indicated by conventional notation in the middle of each loop 506a and 506b. Consequently, the inductor 500 has been found to have a significantly reduced far field at a certain distance from the inductor coil 502. Thus, by making the two loops 506a and 506b substantially symmetrical, cancellation of a significant amount of far field on either side of a second central symmetry axis 510 is achieved. It should be noted, however, that perfect symmetry between the two loops 506a and 506b may be difficult to achieve given the presence of the terminals 504a and 504b.

The mutual electro-magnetic coupling between two concentrically arranged inductors 310,320 is determined by the near field properties of the 8-shaped inductor 310,320. Desired isolation may only be achieved when the two inductors 310,320 are combined in a proper manner.

The symmetry of the inductor 500 with respect to the first axis 508 of symmetry is important for minimizing the generation of common-mode signal components.

Other considerations may include basic layout parameters, such as the width and height of the inductor coil 502 together with the width and spacing of the surrounding metal wires. These parameters, however, are mainly determined by requirements on inductance, Q-factor, chip area, and process layout rules and have only minor influence on mutual electro-magnetic coupling characteristics as long as symmetry of the inductor coil is maintained.

As previously mentioned, the first and second inductors 410,420 may be substantially four-leaf clover-shaped. Each of the first and second inductors 410,420 comprises four inductor loops 412a,412b,412c,412d; 422a,422b,422c, 422d. Further, the first and second inductors 410,420 may be arranged rotated relative to each other such that they have an electro-magnetic coupling coefficient k that is minimized, or at least substantially minimized. Thereby, an angle α between the first axis 416a of symmetry of the first inductor 410 and the first axis 426a of symmetry of the second inductor 420 is in the interval between 40 and 50 degrees. In some embodiments, the angle α is in the interval between 43 and 47 degrees. More specifically the angle α may be substantially 45 degrees.

By arranging the four-leaf clover-shaped first and second inductors 410,420 rotated about 45 degrees relative each other, the electro-magnetic coupling between them is as small as possible, i.e. the electro-magnetic coupling between them is minimized.

In the FIGS. 2-4 only two inductors have been shown, but it should be understood that embodiments of the inductor layout 200,300,400 may comprise more than two inductors. Thus, a number of one or more of the inductors 210,220, 310,320, 410,420 exemplified herein may be combined to form the inductor layout 200,300,400 as long as the plurality of inductors are concentrically arranged on the integrated circuit and as long as all inductors 210,220,310,320, 410, 420 except one is a multi-loop inductor with a first axis 226a,316a,326a,416a,426a of symmetry.

For example, at least a third independent inductor 210, 220,310,320,410,420 may be concentrically arranged with the first and second independent inductors 210,220, 310, 320,410,420 on the integrated circuit. The possible combinations of inductor types and rotations are given by the requirement that each inductor should have a minimum of interaction with both of the other inductors.

Embodiments of the inductor layout 200,300,400 result in a very small mutual electro-magnetic coupling between the inductor coils in spite of the fact that they are positioned in the same area of the integrated circuit. With the expression "very small mutual electro-magnetic coupling" is meant very low mutual inductance and parasitic capacitance between the inductors comprised in the inductor layout 200,300,400. A small amount of capacitive coupling may not be avoided, but it has only a minor impact on inductance and Q-value.

Further, in the FIGS. 2-4 only inductors 210,220,310,320, 410,420 comprising single-turn loops have been shown, but it should be understood that one or more of the inductors 210,220,310,320, 410,420 comprised in the inductor layout 200,300,400 may be a multi-turn inductor comprising at least one multi-turn inductor loop.

Figure 6:
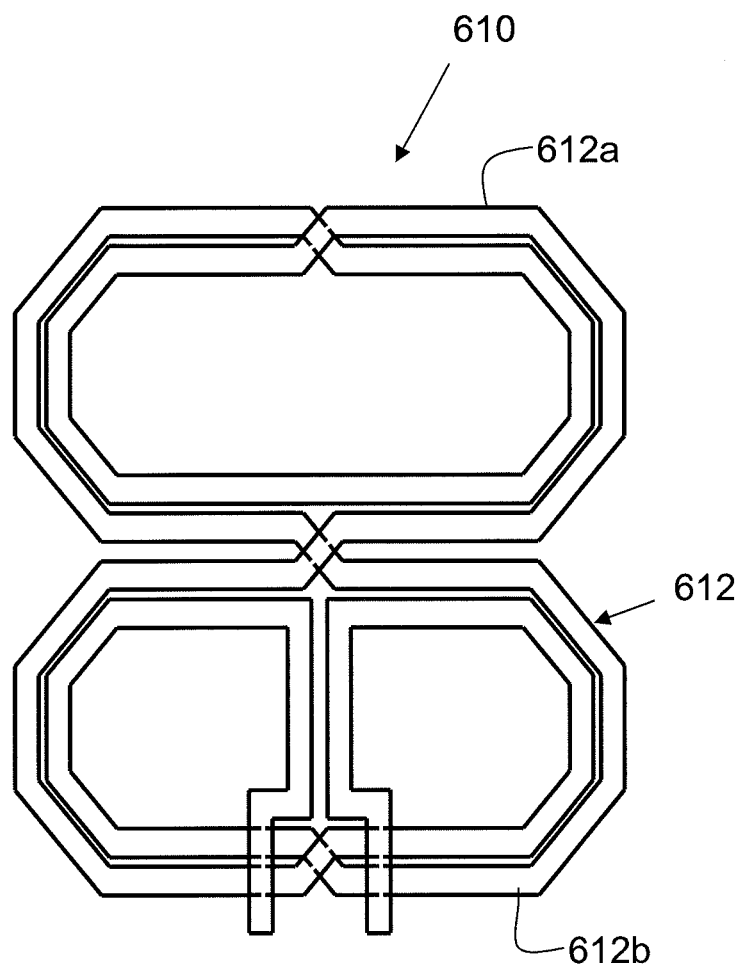
FIG. 6 illustrates embodiments of an 8-shaped inductor comprising two multi-turn inductor loops.

FIG. 6 schematically illustrates an inductor 610 comprising an inductor coil 612. The inductor coil 612 is in the shape of a FIG. 8 and has two double-turn inductor loops 612a,612b. However, even if the inductor 610 shown in FIG. 6 is figure 8-shaped, it should be understood that the inductor 610 may be o-shaped or four-leaf clover-shaped. Further, it should also be understood that the number of turns may be more than two.

In some embodiments, during operation of the inductor layout 200,300,400 only one of the inductors 210,220,310, 320,410,420 is configured to be activated at each point in time. By configuring the inductors 210,220,310,320,410,420 to be activated one at a time, the inductors 210,220,310, 320,410,420 may be concentrically arranged on the integrated circuit without negatively affecting the operation of each other.

Further, one of the first and second inductors 210,220, 310,320,410,420 may have a size that is smaller than the size of the other one of the first and second inductors 210,220, 310,320,410,420. By configuring the inductors to have different sizes, different oscillation frequencies may be obtained when used in a VCO system, which will be described below.

Figure 7:
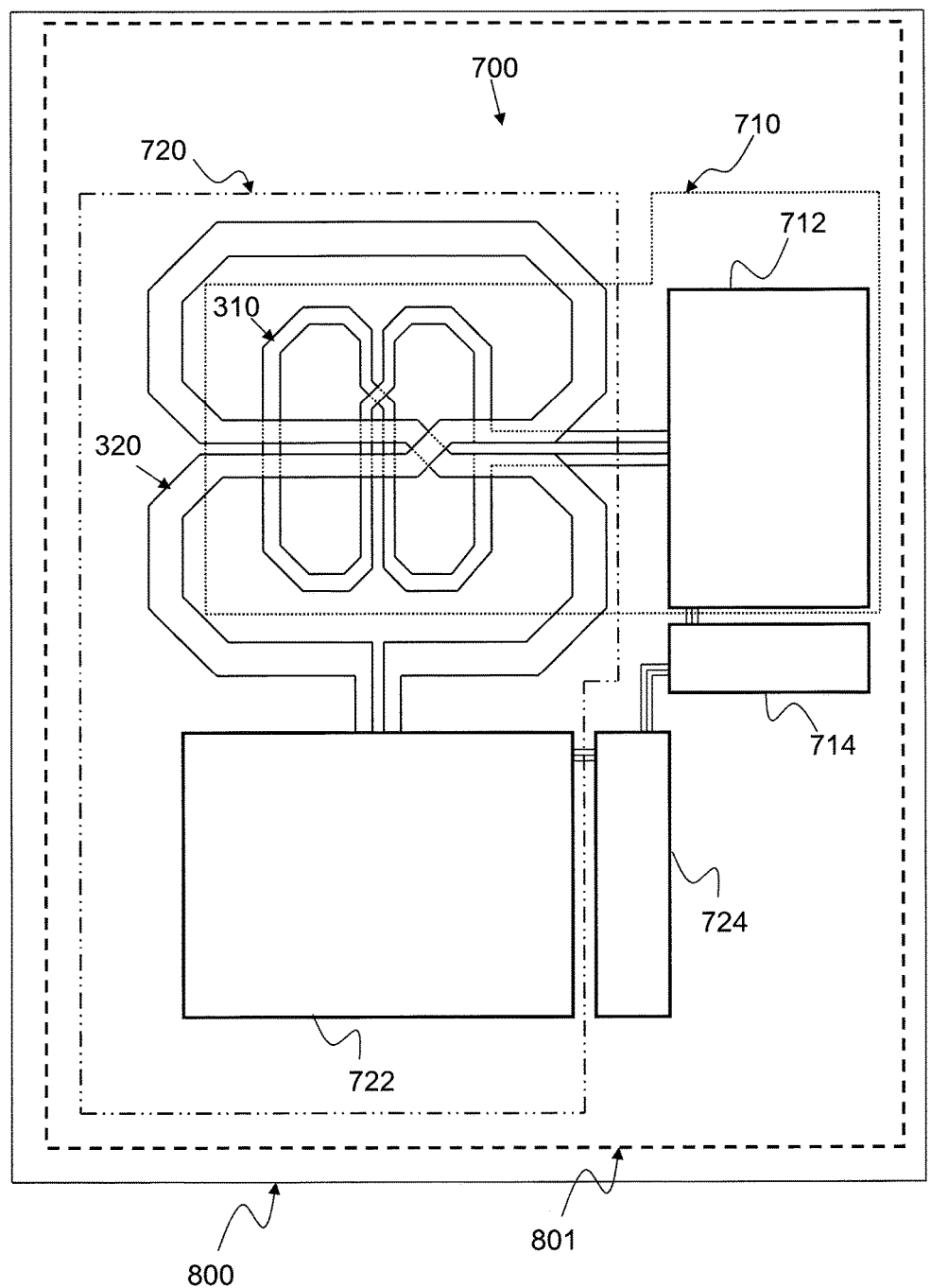
FIG. 7 is a floor-plan layout depicting embodiments of a VCO system.

Embodiments herein do also relate to a VCO system for frequency generation. The VCO system comprises the inductor layout 200,300,400 frequency tuning in an integrated circuit. FIG. 7 schematically illustrates a VCO system 700 comprising a first VCO 710 that comprises the first inductor 210,310,410, and a second VCO 720 that comprises the second inductor 220,320,420. Further, as previously described, one of the first and second inductors 210,310,410; 220,320,420 may have a size that is smaller than the size of the other one of the first and second inductors 210,310,410, 220,320,420, whereby the interaction between them is reduced and the oscillation frequency of the VCO 710,720 comprising the smallest inductor 210,310,410, is higher than the oscillation frequency of the VCO 710,720 comprising the largest inductor 220,320,420. Thus, the combined tuning of the two VCOs' frequency range may be extended significantly as compared to the frequency range of one single VCO.

As schematically illustrated in FIG. 7, the first and second inductors 310,320 are figure 8-shaped, but it should be understood that the VCO system 700 may comprise any one of the previously described embodiments of the inductor layout 200,300,400.

The electro-magnetic properties of embodiments of the inductor layouts 200,300,400 described above and comprising symmetrical inductors 210,310,410, 220,320,420, allow the inductors 210,310,410, 220,320,420 of two different VCOs 710,720 to be put on top of each other in the same area of the integrated circuit as long as both VCOs are not activated at the same time.

Further, the first and second VCOs 710,720 may be configured to comprise a respective capacitor bank 712,722. The first and second VCOs 710,720 may also be configured to share bias and control blocks 714,724, which bias and control blocks 714,724 comprise one or more of a supply voltage regulator, a decoupling mechanism, a buffer to operate the capacitor banks 712,722, control logic for digital frequency tuning and/or bias current settings. The share bias and control blocks 714,724 may be comprised in one of the first and second VCOs 710,720. However, as schematically illustrated in FIG. 7, the share bias and control blocks 714,724 may be arranged external of the first and second VCOs 710,720.

By the sharing of components, the size of the VCO system 700 is reduced as compared to a VCO system comprising no sharing of components. Consequently, a VCO system 700 comprising sharing of components occupies less area on an integrated circuit than a VCO system not comprising sharing of components.

Further, the first VCO 710 and the second VCO 720 may be individually optimized in terms of tuning range, phase noise, and current consumption for their individual operating ranges. The trade-off between these correlated performance parameters may be different for the two VCOs which make it easier to meet the varying specification requirements in different parts of the total combined frequency range. Therefore, a VCO system 700 comprising two VCOs 710, 720 provides better performance than a corresponding a single prior art multi-mode VCO implementation. The area of the integrated circuit may be reduced if the two inductor coils share the same inductor area on the integrated circuit. This is possible with the inductor layout 200,300,400 previously described since the inductor layout 200,300,400 minimizes the mutual electro-magnetic coupling between the inductors to level where it is no longer a problem.

The proposed embodiments of the inductor layout 200, 300,400 make it possible to implement the dual VCO concept with all its advantages with a minimum penalty of increased area of the integrated circuit.

Embodiments herein do also relate to an integrated circuit 800 for frequency tuning. Embodiments of the integrated circuit 800 are schematically illustrated in FIG. 7. As illustrated, the integrated circuit 800 comprises a VCO system 700. In some embodiments, the integrated circuit 800 is an integrated RF transceiver circuit.

Further, embodiments herein do also relate to an integrated circuit sub-system 801 comprising the VCO system 700.

Embodiments herein do also relate to a communication device comprising the integrated circuit 800. In some embodiments, the communication device comprises the integrated RF transceiver circuit. The communication device may comprise e.g. a base station, a network node, a relay station, a user equipment or any other device configured for communication.

Further, embodiments herein relate to the use of an inductor layout 200,300,400 in the integrated circuit 800 for frequency tuning.

FIG. 8 illustrates exemplifying frequency ranges for a dual VCO system 700. As illustrated, a total frequency range may be in an interval between 2.7 GHz and 6.0 GHz for a digital frequency tuning control word ranging from 0 to 31. Thus, by splitting the required total tuning range into two sub-ranges; 2.7-4.7 GHz for the larger VCO 720, and 3.7-6 GHz for the smaller VCO 710, it is possible to reduce the tuning range of each of the respective first and second VCO 710,720.

A smaller tuning range of the respective first and second VCO 710,720 makes it possible to meet the phase noise specification using less supply current to the respective VCO 710,720. This is an advantage since the use of less supply current is an important design goal.

The performance of the respective first and second VCO 710,720 may be optimized separately to meet e.g. the different phase noise specifications and other specifications in different parts of the totals tuning range. Therefore, the dual VCO system 700 provides more flexibility which results in a more optimal solution in many aspects.

Although the description above contains many specifics, they should not be construed as limiting but as merely providing illustrations of some presently preferred embodiments. The technology fully encompasses other embodiments which may become apparent to those skilled in the art. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the described technology for it to be encompassed hereby.

When using the word "comprise" or "comprising" it shall be interpreted as non-limiting, i.e. meaning "consist at least of".

When using the word "action"/"actions" it shall be interpreted broadly and not to imply that the actions have to be carried out in the order mentioned. Instead, the actions may be carried out in any suitable order other than the order mentioned. Further, some action/actions may be optional.

The embodiments herein are not limited to the above described preferred embodiments. Various alternatives, modifications and equivalents may be used. Therefore, the above embodiments should not be taken as limiting the scope of the invention, which is defined by the appending claims.

What is claimed is:

1. An inductor layout comprising:
    a first inductor; and
    a second inductor;
    wherein the first and second inductors are concentrically arranged on an integrated circuit; and
    wherein at least one of the first and second inductors comprises a first multi-loop inductor with a first axis of symmetry;
    wherein the first inductor and the second inductor show no or low electromagnetic interaction with each other; and
    wherein the first and second inductors have an electromagnetic coupling coefficient k less than 0.1.

2. The inductor layout of claim 1, wherein the multi-loop inductor comprises an even number of inductor loops arranged in a plane of the multi-loop inductor such that magnetic fields emanating from the inductor loops substantially cancel each other.

3. The inductor layout of claim 2, wherein the other one of the at least one of the first and second inductors comprises a second multi-loop inductor having a second axis of symmetry, and wherein the first and second inductors are rotated relative to each other such that they have an electro-magnetic coupling coefficient k that is substantially minimized.

4. The inductor layout of claim 3, wherein:
    each of the first and second inductors comprises two inductor loops;
    each of the first and second inductors is substantially figure 8-shaped; and
    the first and second inductors are rotated relative to each other such that an angle between the first axis of symmetry of the first inductor and the second axis of symmetry of the second inductor is about 90 degrees.

5. The inductor layout of claim 3, wherein:
    each of the first and second inductors comprises four inductor loops;
    each of the first and second inductors is substantially four-leaf clover-shaped; and
    the first and second inductors are rotated relative to each other such that an angle between the first axis of symmetry of the first inductor and the second axis of symmetry of the second inductor is about 45 degrees.

6. The inductor layout of claim 1, further comprising at least a third inductor concentrically arranged with the first and second inductors on the integrated circuit.

7. The inductor layout of claim 6, wherein at least one of the first inductor, the second inductor, and the at least third inductor comprises a multi-turn inductor comprising at least one multi-turn inductor loop.

8. The inductor layout of claim 1, wherein only one of the inductors is configured to be activated at each point in time.

9. The inductor layout of claim 1, wherein the first and second inductors are not the same size.

10. The inductor layout of claim 1, wherein at least one of the first inductor and the second inductor comprises a multi-turn inductor comprising at least one multi-turn inductor loop.

11. A Voltage-Controlled Oscillator (VCO) system for frequency generation in an integrated circuit, the VCO system comprising:
    an inductor layout comprising:
        a first inductor; and
        a second inductor;
    wherein the first and second inductors are concentrically arranged on an integrated circuit; and
    wherein at least one of the first and second inductors comprises a multi-loop inductor with a first axis of symmetry;

wherein the first inductor and the second inductor show no or low electromagnetic interaction with each other; and wherein the first and second inductors have an electromagnetic coupling coefficient k less than 0.1.

12. The VCO system of claim 11, wherein the multi-loop inductor comprises an even number of inductor loops arranged in a plane of the multi-loop inductor such that magnetic fields emanating from the inductor loops substantially cancel each other.

13. The VCO system of claim 11, further comprising at least a third inductor concentrically arranged with the first and second inductors on the integrated circuit.

14. The VCO system of claim 11, wherein:
a first VCO comprises the first inductor;
a second VCO comprises the second inductor; and
a size of one of the first and second inductors is smaller than a size of the other one of the first and second inductors, whereby the oscillation frequency of the VCO comprising the smaller inductor is higher than the oscillation frequency of the VCO comprising the larger inductor.

15. The VCO system of claim 14, wherein the first and second VCOs comprise respective capacitor banks, and wherein the first and second VCOs are configured to share bias and control blocks.

16. The VCO system of claim 11, wherein at least one of the first inductor and the second inductor comprises a multi-turn inductor comprising at least one multi-turn inductor loop.

17. An integrated RF transceiver circuit comprising:
a Voltage-Controlled Oscillator (VCO) system for frequency generation in an integrated circuit, the VCO system comprising:
an inductor layout comprising
a first inductor; and
a second inductor;
wherein the first and second inductors are concentrically arranged on an integrated circuit; and
wherein at least one of the first and second inductors comprises a multi-loop inductor with a first axis of symmetry;
wherein the first inductor and the second inductor show no or low electromagnetic interaction with each other; and
wherein the first and second inductors have an electromagnetic coupling coefficient k less than 0.1.

18. The integrated RF transceiver circuit of claim 17, wherein at least one of the first inductor and the second inductor comprises a multi-turn inductor comprising at least one multi-turn inductor loop.

19. An integrated circuit comprising
a Voltage-Controlled Oscillator (VCO) system for frequency generation in an integrated circuit, the VCO system comprising:
an inductor layout comprising
a first inductor; and
a second inductor; and
control logic operatively coupled to the VCO system and configured to implement frequency tuning in the integrated circuit;

wherein the first and second inductors are concentrically arranged on an integrated circuit; and
wherein at least one of the first and second inductors comprises a multi-loop inductor with a first axis of symmetry;
wherein the first inductor and the second inductor show no or low electromagnetic interaction with each other; and
wherein the first and second inductors have an electromagnetic coupling coefficient k less than 0.1.

20. The integrated circuit of claim 19, wherein at least one of the first inductor and the second inductor comprises a multi-turn inductor comprising at least one multi-turn inductor loop.

21. A communication device in a wireless network, the communication device comprising:
an integrated RF transceiver circuit comprising a Voltage-Controlled Oscillator (VCO) system for frequency generation in an integrated circuit, the VCO system comprising:
an inductor layout comprising
a first inductor; and
a second inductor;
wherein the first and second inductors are concentrically arranged on an integrated circuit; and
wherein at least one of the first and second inductors comprises a multi-loop inductor with a first axis of symmetry;
wherein the first inductor and the second inductor show no or low electromagnetic interaction with each other; and
wherein the first and second inductors have an electromagnetic coupling coefficient k less than 0.1.

22. The communication device of claim 21 wherein the communication device comprises at least one of a base station, a network node, and a relay station.

23. The communication device of claim 21 wherein the communication device comprises a user equipment.

24. The communication device of claim 21, wherein at least one of the first inductor and the second inductor comprises a multi-turn inductor comprising at least one multi-turn inductor loop.

25. An inductor layout comprising:
a first inductor; and
a second inductor;
wherein the first and second inductors are concentrically arranged on an integrated circuit;
wherein at least one of the first and second inductors comprises a first multi-loop inductor with a first axis of symmetry;
wherein the other one of the at least one of the first and second inductors comprises a second multi-loop inductor having a second axis of symmetry; and
wherein the first and second inductors are rotated relative to each other such that they have an electro-magnetic coupling coefficient that is substantially minimized.

26. The inductor layout of claim 25, wherein at least one of the first inductor and the second inductor comprises a multi-turn inductor comprising at least one multi-turn inductor loop.

* * * * *

UNITED STATES PATENT AND TRADEMARK OFFICE
CERTIFICATE OF CORRECTION

PATENT NO. : 10,121,845 B2
APPLICATION NO. : 15/041108
DATED : November 6, 2018
INVENTOR(S) : Mattsson et al.

It is certified that error appears in the above-identified patent and that said Letters Patent is hereby corrected as shown below:

In the Specification

In Column 1, Line 6, delete "2014, which" and insert -- 2014, now Pat. No. 9,299,764, which --, therefor.

In Column 5, Line 65, delete "relative each" and insert -- relative to each --, therefor.

In Column 6, Line 67, delete "relative each" and insert -- relative to each --, therefor.

Signed and Sealed this
Twenty-first Day of May, 2019

Andrei Iancu
*Director of the United States Patent and Trademark Office*